United States Patent
Lee et al.

(10) Patent No.: US 9,625,553 B2
(45) Date of Patent: Apr. 18, 2017

(54) METHOD AND APPARATUS FOR ACQUIRING B1 MAGNETIC FIELD INFORMATION

(71) Applicants: Samsung Electronics Co., Ltd., Gyeonggi-do (KR); Industry Academic Cooperation Foundation Kyunghee University, Gyeonggi-do (KR)

(72) Inventors: Ju-hyung Lee, Gyeonggi-do (KR); Soo-yeol Lee, Gyeonggi-do (KR)

(73) Assignees: Samsung Electronics Co., Ltd., Yeongtong-gu, Suwon-si, Gyeonggi-do (KR); Industry Academic Cooperation Foundation Kyunghee University, Giheung-gu, Yongin-si, Gyeonggi-do (KR)

(*) Notice: Subject to any disclaimer, the term of this patent is extended or adjusted under 35 U.S.C. 154(b) by 638 days.

(21) Appl. No.: 14/096,317

(22) Filed: Dec. 4, 2013

(65) Prior Publication Data

US 2014/0152307 A1 Jun. 5, 2014

Related U.S. Application Data

(60) Provisional application No. 61/733,100, filed on Dec. 4, 2012.

(30) Foreign Application Priority Data

Feb. 26, 2013 (KR) ........................ 10-2013-0020672

(51) Int. Cl.
*G01V 3/00* (2006.01)
*G01R 33/565* (2006.01)
*G01R 33/24* (2006.01)

(52) U.S. Cl.
CPC ....... *G01R 33/5659* (2013.01); *G01R 33/246* (2013.01)

(58) Field of Classification Search
USPC ........................................................ 324/309
See application file for complete search history.

(56) References Cited

U.S. PATENT DOCUMENTS 7,825,662 B2 * 11/2010 Lai ..................... G01R 33/5613
324/307
8,228,063 B2 * 7/2012 Kimura .................. A61B 5/055
324/307
(Continued)

FOREIGN PATENT DOCUMENTS

JP 2007-289690 A 11/2007

OTHER PUBLICATIONS

Van De Moortele et al.; "B1 Destructive Interferences and Spatial Phase Patterns at 7 T with a Head Transceiver Array Coil"; Aug. 7, 2005; Wiley-Liss, Inc.
(Continued)

*Primary Examiner* — Rodney Fuller
(74) *Attorney, Agent, or Firm* — Cha & Reiter, LLP

(57) ABSTRACT

A system acquires RF magnetic field information (B1 magnetic field information) in response to generated radio frequency (RF) pulses applied to a target object via at least one of a plurality of RF coil elements in a magnetic resonance imaging (MRI) system. The system acquires first information comprising B1 magnetic field phase information of a B1 magnetic field formed by the respective RF coil elements and acquires second information comprising B1 magnetic field phase information of a B1 magnetic field formed by a combination of two or more of a plurality of RF coil elements. The system acquires third information comprising B1 magnetic field phase information by combining the first information and the second information and processes the first, second and third information in providing a B1 map indicating spatial distribution of a B1 magnetic field.

19 Claims, 3 Drawing Sheets

(56) References Cited

U.S. PATENT DOCUMENTS

| | | | |
|---|---|---|---|
| 8,305,077 B2 | 11/2012 | Morrell | |
| 2007/0247155 A1 | 10/2007 | Zhu | |
| 2010/0026299 A1* | 2/2010 | King | G01R 33/3415 324/309 |
| 2010/0171499 A1* | 7/2010 | Sharp | G01R 33/3415 324/318 |
| 2012/0163692 A1 | 6/2012 | Harvey et al. | |
| 2012/0280683 A1 | 11/2012 | Sacolick et al. | |
| 2013/0009641 A1* | 1/2013 | Hori | G01R 33/3852 324/309 |

OTHER PUBLICATIONS

Van Lier et al.; "Comparing Electric Properties Tomography at 1.5, 3 and 7 T"; Proc. Intl. Soc. Mag. Reson. Med. 19; 2011.

Katscher et al; "B1-Based Specific Energy Absorption Rate Determination for Nonquadrature Radiofrequency Excitation"; Jan. 21, 2012; Wiley Periodicals, Inc.

Zhang et al.; "Complex B1 Mapping and Electrical Properties Imaging of the Human Brain Using a 16-channel Transceiver Coil at 7T"; May 10, 2012; Wiley Periodicals, Inc.

Michel, et al.; "B1+ and B1− phase mapping using DREAM sequence"; Biomedical Engineering, Kyung Hee University, Yongin-si, Gyeonggi-do, Korea, prior to Jan. 20, 2015.

Van Lier et al., "B1+ Phase Mapping at 7T and its Application for In Vivo Electrical Conductivity Mapping", Wiley Periodicals, Inc., Apr. 11, 2011, pp. 552-561.

\* cited by examiner

METHOD AND APPARATUS FOR ACQUIRING B1 MAGNETIC FIELD INFORMATION

CLAIM OF PRIORITY

This application claims the benefit of U.S. Provisional Application No. 61/733,100, filed on Dec. 4, 2012, in the U.S. Patent and Trademark Office, and Korean Patent Application No. 10-2013-0020672, filed on Feb. 26, 2013, in the Korean Intellectual Property Office, the disclosures of which are incorporated herein in their entirety by reference.

BACKGROUND

1. Technical Field

A system concerns acquiring a B1 map reflecting information regarding a B1 magnetic field formed by a combination of two or more of a plurality of RF coil elements.

2. Description of the Related Art

A known magnetic resonance imaging (MRI) system provides non-invasive imaging, improved contrast of tissues compared to a computer tomography (CT) element, and is free of bone tissue related artifacts. Furthermore, a magnetic resonance imaging (MRI) system is capable of capturing various tomography images in desired directions without relocating a target object, thus being widely used. A known MRI system generates a magnetic resonance (MR) image using differences between characteristics of tissues of a target object that reflects differences between magnetic resonance characteristics of tissues of a target object. Uniformity of a magnetic field (B1) generated by radio frequency (RF) pulses in an MRI system affects uniformity of an MR image. Therefore, a B1 shimming process is employed to improve B1 uniformity. The B1 shimming process may include driving respective coil elements included in a transmission RF coil unit having separate circuit structures by driving a plurality of coil elements with signals having different magnitudes and phases. To perform the B1 shimming, it is necessary to determine spatial B1 magnetic field distribution (B1 mapping).

A B1 magnetic field generated by RF pulses may be separated into a transmission RF magnetic field (B1+ magnetic field) component rotating in a clockwise direction and a reception RF magnetic field (B1− magnetic field) rotating in a counterclockwise direction. Here, the B1+ magnetic field induces nucleomagnetic resonance with respect to a magnetization vector, thereby laying the magnetization vector on a transverse plane. When a magnetization vector lies on a transverse plane, the magnetization vector rotates on the transverse plane at the Larmor frequency, and the rotation of the magnetization vector induces an electromotive force (EMF) in a reception RF coil. MR signals received by the reception RF coil are affected by the B1− formed by the reception RF coil. In an MRI system, a B1+ magnetic field formed by a transmission RF coil contributes to formation of MR signals in an RF signal transmission mode, whereas a B1− magnetic field formed by a reception RF coil contributes to formation of MR signals in an RF signal reception mode.

A transmission RF magnetic field (B1+ magnetic field) is a magnetic field which induces actual magnetic resonance by rotating a magnetization vector of at least one type of atomic nucleus included in a target object in a main magnetic field direction when RF pulses are applied to the target object via an RF coil in an MRI system. Therefore, in an MRI system, it is necessary to suppress formation of a B1− magnetic field and strengthen a B1+ magnetic field as much as possible to acquire a high-quality MR image. Furthermore, to form a uniform B1+ magnetic field, it is necessary to precisely measure magnitude and spatial phase distribution of the B1+ magnetic field.

SUMMARY

A system derives B1 information regarding phase distribution of a B1+ magnetic field formed in a target object by applying RF pulses to the target object via a plurality of RF coil elements in a magnetic resonance imaging (MRI) system. A system acquires RF magnetic field information (B1 magnetic field information) in response to generated radio frequency (RF) pulses applied to a target object via at least one of a plurality of RF coil elements in a magnetic resonance imaging (MRI) system. The system acquires first information comprising B1 magnetic field phase information of a B1 magnetic field formed by the respective RF coil elements and acquires second information comprising B1 magnetic field phase information of a B1 magnetic field formed by a combination of two or more of a plurality of RF coil elements. The system acquires third information comprising B1 magnetic field phase information by combining the first information and the second information in providing a B1 map indicating spatial distribution of a B1 magnetic field.

In a feature the system acquires phase information of transmission RF magnetic fields (B1+ magnetic fields) as the third information by eliminating phase information of a reception RF magnetic field (B1− magnetic field) from the first information by using the second information. The B1+ magnetic fields comprise magnetic field elements which rotate in a same direction as a direction in which a magnetization vector of at least one atomic nucleus, which is magnetized by a main magnetic field of the MRI system and is included in a target object, rotates. The system acquires the phase information of the B1− magnetic field by combining the first information and the second information and the B1− magnetic field comprises a magnetic field element which rotates in a direction opposite to the direction in which the B1+ magnetic field rotates. The system acquires the first information formed by the respective RF coil elements by for individual coils of the plurality of RF coil elements, selecting one of the plurality of RF coil elements; applying the RF pulses to the target object via the selected RF coil element; and acquiring the first information using echo response signals received from the target object. The first information comprises phase information of a B1+ magnetic field formed by the respective RF coil elements and phase information of a B1− magnetic field.

In a further feature, the system acquires the second information by applying the RF pulses to the target object concurrently via the combination of two or more of the plurality of RF coil elements and acquiring the second information based on echo response signals received from the target object. The acquiring of the second information comprises acquiring the second information by concurrently driving the plurality of RF coil elements. The second information comprises phase information of a B1+ magnetic field formed by the combination of two or more of the plurality of RF coil elements and phase information of a B1− magnetic field. The MRI system uses a high magnetic field equal to 3 Tesla (T) or higher.

In yet another feature a B1 information acquiring system in an MRI unit includes at least one of a plurality of radio frequency (RF) coil elements for acquiring B1 magnetic field information in response to RF pulses applied to a target object. The B1 information acquiring apparatus comprises a control unit, which controls a plurality of RF coil elements. The control unit comprises: a first information acquiring unit for acquiring first information comprising B1 magnetic field phase information of a B1 magnetic field formed by the respective RF coil elements; a second information acquiring unit acquiring second information comprising B1 magnetic field phase information of a B1 magnetic field formed by a combination of two or more of a plurality of RF coil elements; and a third information acquiring unit for acquiring third information comprising B1 magnetic field phase information by combining the first information and the second information.

In an additional feature, the control unit acquires phase information of transmission RF magnetic fields (B1+ magnetic fields) as the third information by eliminating phase information of a reception RF magnetic field (B1− magnetic field) from the first information by using the second information. The B1+ magnetic fields comprise magnetic field elements which rotate in a same direction as a direction in which a magnetization vector of at least one atomic nucleus, which is magnetized by a main magnetic field of the MRI system and is included in a target object, rotates. The control unit further comprises a B1− information acquiring unit, which acquires the phase information of the B1− magnetic field by combining the first information and the second information, and the B1− magnetic field comprises a magnetic field element rotating in a direction opposite to the direction in which the B1+ magnetic fields rotate. Also, the first information acquiring unit is configured to, for individual coils of the plurality of RF coil elements, select one of the plurality of RF coil elements; apply the RF pulses to the target object via the selected RF coil element; receive echo response signals from the target object; and acquire the first information based on the echo response signals received from the target object. The first information comprises phase information of a B1+ magnetic field formed by the respective RF coil elements and phase information of a B1− magnetic field. The second information acquiring unit is configured to apply the RF pulses to the target object concurrently using the combination of two or more of the plurality of RF coil elements, receive echo response signals from the target object and acquire the second information using the echo response signals. The second information acquiring unit acquires the second information by concurrently driving the plurality of RF coil elements. The second information comprises phase information of a B1+ magnetic field formed by the combination of two or more of the plurality of RF coil elements and phase information of a B1− magnetic field. Also a computer readable recording medium has recorded thereon a computer program for implementing the system.

BRIEF DESCRIPTION OF THE DRAWINGS

The above and other features and advantages of the system will become more apparent by description of exemplary embodiments with reference to the attached drawings in which.

DETAILED DESCRIPTION

Expressions such as "at least one of," when preceding a list of elements, modify the entire list of elements and do not modify the individual elements of the list.

In addition, although the terms used herein are selected from generally known and used terms, some of the terms have been selected by the applicant at his or her discretion, the detailed meanings of which are described in relevant parts of the description herein. Terms such as " . . . unit" and "module" described in specification denote an element for performing at least one function or operation, and may be implemented in hardware, software or a combination of hardware and software. Hereinafter, the term "target object" may be any of various organs in a human body or in an animal or may be a particular location in a human body or in an animal. Furthermore, the target object may be a phantom, where the term 'phantom' refers to materials having volumes very similar to densities and effective atomic numbers of living organisms. For example, the phantom may be a spherical water phantom having properties similar to those of a human body.

Hereinafter, the term "user" refers to a medical expert and may include a doctor, a nurse, a medical technologist, a medical imaging expert, and a medical device repairman, but is not limited thereto.

Figure 1:
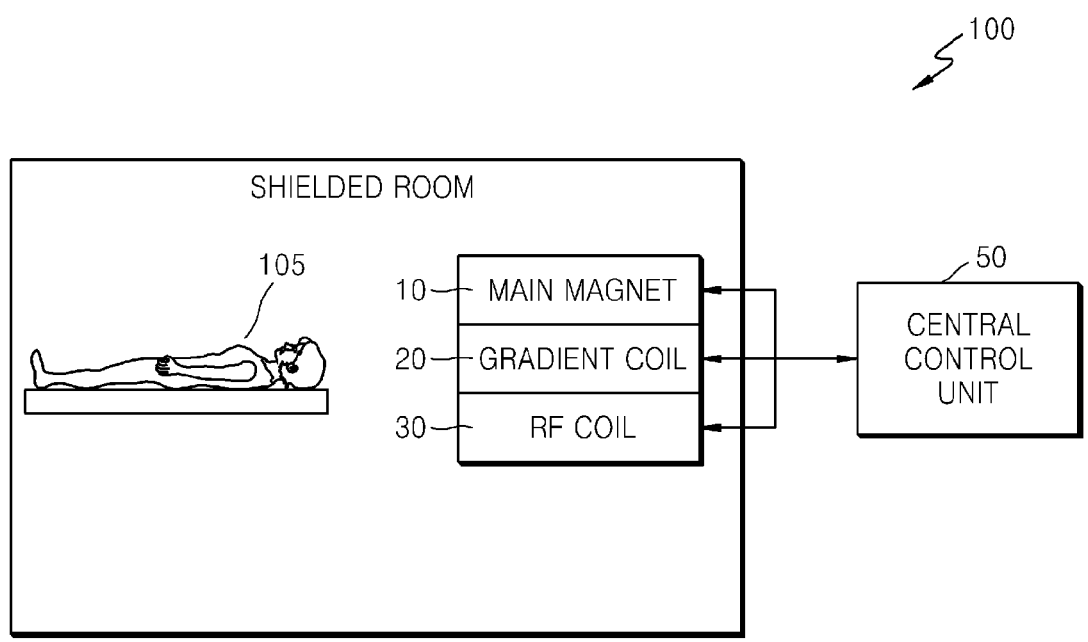
FIG. 1 shows a magnetic resonance imaging (MRI) system according to invention principles.

FIG. 1 shows a magnetic resonance imaging (MRI) system 100 where a target object 105 is imaged in a cylindrical gantry in a shielded room which blocks external radio frequency (RF) signals. In the gantry, a main magnetic field B0 is formed by a main magnet 10. Magnetic field gradient pulses are transmitted by a gradient coil 20 and form a magnetic gradient field. When the main magnetic field B0 is formed outside a target object, nuclei of atoms in the target object precess in the direction of the main magnetic field B0. A frequency of the precession, that is, a resonant frequency is proportional to an intensity of the main magnetic field B0, according to the Larmor equation. Here, a proportional constant thereof is referred to as a gyromagnetic ratio.

When an electromagnetic wave having a same frequency as a resonant frequency is applied to a precessing atomic nucleus, the atomic nuclease resonates and a magnetization vector of the atomic nucleus is oriented perpendicular to the main magnetic field B0, where the rotated magnetization vector may become a signal source for a MR image. When RF pulses having a same frequency as a resonant frequency are transmitted to an atomic nucleus resonating at the resonant frequency and transmission of the RF pulses is terminated, the atomic nucleus emits energy absorbed from the RF pulses, and the rotated magnetization vector induces voltage signals in an adjacent RF coil comprising magnetic resonance signals. The intensity of a magnetic resonance signal is proportional to the magnitude of a magnetization vector, and the magnitude of the magnetization vector is proportional to the intensity of the main magnetic field B0. Therefore, the stronger the main magnetic field B0, the higher the signal-noise-ratio (SNR) of an MR image. The MRI system 100 may acquire an MR image using RF signals emitted by the atomic nucleus. An RF coil applies electromagnetic waves to the target object 105 for resonating a magnetization vector in the target object 105 and receives an echo magnetic resonance signal generated by the magnetization vector rotated on a transverse plane due to the resonance.

A single RF coil may be used for both transmission and reception of RF signals. Alternatively, a transmission RF coil and a reception RF coil may be used for transmission and reception of RF signals, respectively. Since a transmission coil is generally installed inside a gantry of the MRI system 100, the transmission coil may be arranged on a cylindrical frame having a sufficient magnitude for accommodating a human body therein. Meanwhile, a reception coil is generally used by being attached to the target object 105. Therefore, if the target object 105 is a human body, the reception coil is generally manufactured in correspondence to shapes of human body parts, e.g., a head coil, a neck coil, a waist coil, for example. The RF coil receives RF signals generated by a predetermined part of the target object 105 and forwards the RF signals to a central processing unit (CPU) 50 in an operating room separated from a shielded room, where the RF signals may be converted to an MR image via a signal processing process. Here, a weak magnetic field generated by RF pulses, e.g., a magnetic field having an intensity of around 50 mT comprises a B1 magnetic field.

Different types of magnetic fields are employed for forming an MR image. A main magnetic field magnetizes atomic nuclei of magnetically resonating atoms in a human body, such as hydrogen, phosphor, and sodium. A spatially linear gradient magnetic field is used for spatially locating an echo RF signal. An RF coil generated RF magnetic field (B1 magnetic field) rotates magnetization vectors of atomic nuclei magnetized for generating MR image signals on a transverse plane. In an MRI system, B1 uniformity affects uniformity of an MR image. Therefore, B1 shimming is employed to improve B1 uniformity. The B1 shimming improves uniformity of a high frequency magnetic field within an imaged region by arranging a transmission RF coil to have a phase arrangement structure including a plurality of independent coil elements activated using signals having individual magnitudes and phases, respectively. To perform the B1 shimming, it is necessary to determine distribution of a magnetic field generated by a coil element while the coil element is driven comprising B1 mapping.

To determine spatial distribution of a B1 magnetic field, magnitude and phase distribution of the B1 magnetic field are determined. During B1 shimming, it a magnitude of high frequency current driving a RF coil element and a phase are controlled. A sum of magnetic fields formed by the respective coil elements may become spatially uniform as being added to or subtracted from one another according to phase of high frequency currents flowing in the respective coil elements. The B1 magnetic field formed by RF pulses may be separated into a transmission RF magnetic field (B1+ magnetic field) and a reception RF magnetic field (B1− magnetic field). The B1+ magnetic field may be a magnetic field element which rotates in a same direction as a direction in which a magnetization vector of at least one atomic nucleus, which is magnetized by the main magnetic field of an MRI system and is included in a target object, rotates. The B1− magnetic field may be a magnetic field element rotating in a direction opposite to the direction in which the B1+ magnetic field rotates. If the B1+ magnetic field is a magnetic field rotating a magnetization vector in a positive direction, the B1− magnetic field is a magnetic field rotating a magnetization vector in the opposite direction, that is, a negative direction. For example, if a direction in which a magnetization vector of hydrogen atoms rotates with respect to the main magnetic field is the positive direction, a direction opposite thereto may be the negative direction.

Although magnitudes and phases of a B1+ magnetic field and a B1− magnetic field are almost the same in a low magnetic field MRI system, magnitudes and phases of a B1+ magnetic field and a B1− magnetic field may significantly differ in a high magnetic field (3 T or higher) MRI system. When RF pulses are applied to a target object via an RF coil, a B1+ magnetic field and a B1− magnetic field is formed in the target object. Since the B1− magnetic field does not contribute to magnetic resonance, it is necessary to suppress formation of the B1− magnetic field as much as possible and increase the intensity of the B1+ magnetic field. Methods of suppressing formation of the B1− magnetic field relative to the B1+ magnetic field include a quadrature driving method for driving two transmission RF coils with a phase difference of 90 degrees. For example, one of the transmission RF coils may be driven with a current waveform of cos ωt, whereas the other transmission RF coil may be driven with a current waveform of sin wt. Using quadrature driving, a B1+ magnetic field may be substantially exclusively formed, and thus power to be transmitted via RF coils may be reduced by half. However, in a high magnetic field (3 T or higher) MRI system, quadrature driving in practice is imperfect. B1 shimming, provides a more uniform B1+ magnetic field by controlling magnitudes and phases of currents applied to the respective coil elements, as compared to the quadrature driving.

When RF pulses are applied to a human body, wavelengths of the RF pulses become short due to high electrical permittivity of water molecules. Therefore, a phase of a B1+ magnetic field may significantly differ according to locations on a target object. In order to perform B1 shimming, it is desirable to determine the magnitude of the B1+ magnetic field and its associated phase distribution. Furthermore, when the phase distribution of a B1+ magnetic field is determined, electrical conductivity distribution in a human body may be calculated. Although a B1 magnetic field induces magnetic resonance in a human body, heat is also accumulated that may thermally destroy cells and harming a patient. Heat accumulation in a human body due to a B1 magnetic field is affected by the B1 magnetic field and by electrical conductivity in the human body. Therefore, it is desirable to determine electrical conductivity distribution in a human body to predict heat accumulation in the human body due to the B1 magnetic field. When electrical conductivity distribution in a human body is determined based on phase distribution of a B1+ magnetic field, distribution of heat accumulated in the body of a patient may be predicted.

When a phase preserving image is reconstructed from MR image signals, phase $\phi$ of a B1 magnetic field corresponding to a pixel of a MR image is the sum of phase $\phi_{B1+}$ of a B1+ magnetic field and phase $\phi_{B1-}$ of a B1− magnetic field. So, phase $\phi$ of a B1 magnetic field satisfies Equation 1 below.

$$\phi=\phi_{B1+}+\phi_{B1-}.$$ [Equation 1]

Here, if it is assumed that a phase of a B1+ magnetic field is identical to a phase of a B1− magnetic field, the phase $\phi_{B1+}$ of the B1+ magnetic field may be calculated based on the phase $\phi$ of the B1 magnetic field as shown in Equation 2 below.

$$\phi_{B1+}=\phi/2$$ [Equation 2]

In a low magnetic field (1.5 T or lower) MRI system, it may be assumed that a phase of a B1+ magnetic field is almost identical to a phase of a B1− magnetic field, and thus Equation 2 may be applied without a significant error.

However, a significant error occurs when Equation 2 is applied to a high magnetic field (3 T or higher) MRI system. Particularly, in the case of imaging the abdomen or the breast, which is larger than the head, a significant error may occur when phase distribution of a B1+ magnetic field is determined according to Equation 2. Information regarding a phase of a B1+ magnetic field acquired via a method of acquiring B1 information may be utilized for B1 shimming for improving spatial uniformity of the B1+ magnetic field and electrical property tomography (EPT) for imaging electrical conductivity distribution in a human body. Although a transmission RF coil may form both a B1+ magnetic field and a B1− magnetic field, it is the B1+ magnetic field that exclusively induces nucleomagnetic resonance with respect to a magnetization vector, thereby rotating a magnetization vector on a transverse plane. When the magnetization vector is rotated on the transverse plane, the magnetization vector rotates on the transverse plane at a resonant frequency, and the rotation of the magnetization vector induces an electromotive force (EMF) in a reception RF coil according to the Faraday's Law.

MR signals received by the reception RF coil are affected by a B1− magnetic field formed by the reception RF coil. A B1+ magnetic field element of the transmission RF coil contributes to formation of MR signals in a transmission mode in which RF pulses are applied to a target object, whereas B1+ magnetic field element of the reception RF coil contributes to formation of MR signals in a reception mode in which response signals are received from the target object. When signals received by the reception RF coil are amplified by using an RF amplifier and demodulated to a sine wave at the Larmor frequency, MR signals in the base band may be acquired. A computer acquires an MR image by receiving and processing the MR signals in the base band.

Spatial uniformity of a B1+ magnetic field formed by a transmission RF coil affects uniformity of an MR image and brightness of a particular pixel in an MR image is affected by a flip angle of a magnetization vector at a location corresponding to the pixel, where the flip angle of the magnetization vector is proportional to the magnitude of a B1+ magnetic field. In order to form a uniform B1+ magnetic field, an RF coil needs to have an appropriate shape. For example, a bird-cage RF coil widely used as a transmission RF coil is designed such that a plurality of electric wires form a high-frequency magnetic field and are arranged at equal relative angles on a cylindrical frame. The plurality of electric wires in combination form a capacitor. A birdcage RF coil may form a highly uniform B1 magnetic field. However, in a high magnetic field (3 T or higher), uniformity of a B1 magnetic field may be impaired due to a target object of an MR image. Therefore, in a high magnetic field (3 T or higher) MRI system, uniformity of a B1 magnetic field may be improved by performing B1 shimming by using a phased array coil including a plurality of coil elements.

A phased array coil includes a plurality of coil elements and individual coil elements may have an individual particular shape. For example, a coil element may have a shape corresponding to a micro-strip line or a flat loop. Each of the coil elements is independently driven to minimize electric and magnetic couplings between the respective coil elements. If there is an electric or magnetic coupling between coil elements, when an arbitrary coil element is driven, another adjacent coil element is also driven. Currents driving the respective coil elements oscillate at the Larmor frequency and may be independently controlled to have different magnitudes and phases controlled by using a numerically controlled oscillator, for example.

For effective B1 shimming, it is desirable to know spatial distributions of magnitudes and phases of B1+ magnetic fields formed by the respective transmission RF coil elements. Therefore, a method advantageously precisely determines magnitudes and phases of the B1+ magnetic fields. However, known systems fail to distinguish a phase of a B1+ magnetic field from a phase of a B1− magnetic field from a phases of an MR signal, which is the sum of the phase of the B1+ magnetic field and the phase of the B1− magnetic field. The system advantageously acquires phase distribution of the B1+ magnetic field.

Figure 2:
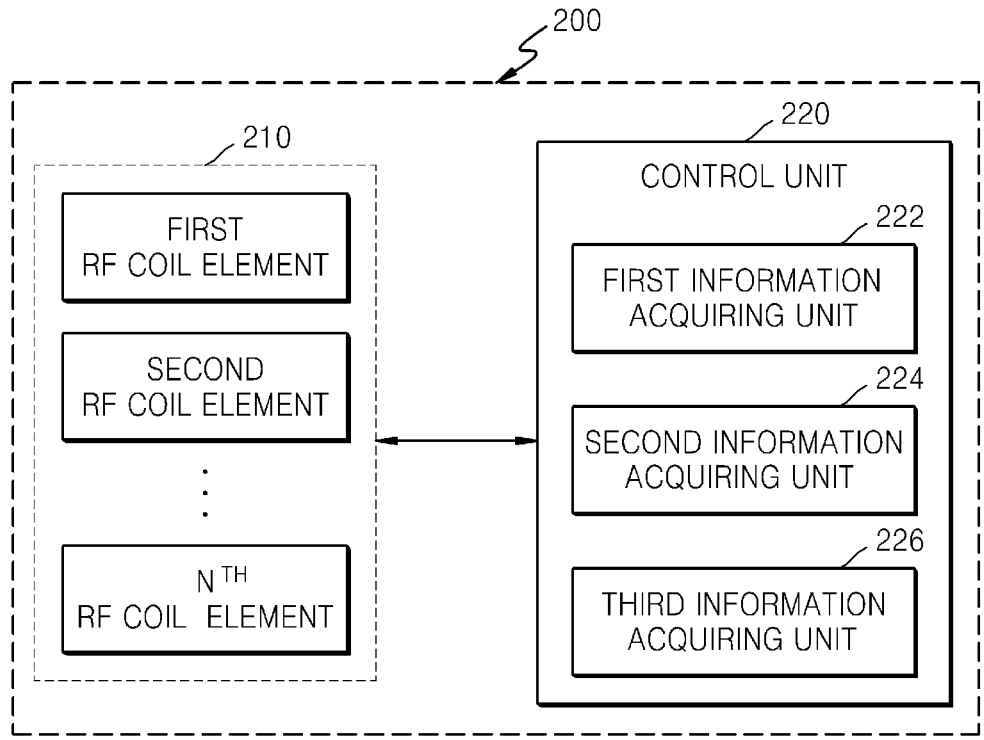
FIG. 2 shows a B1 information processing apparatus according to invention principles.

FIG. 2 shows a B1 information acquiring apparatus 200 that may be either physically separated from, or integrated with, the MRI system 100 for providing an MR image regarding a target object by using nucleomagnetic resonance. Apparatus 200 may include a plurality of RF coil elements 210 and a control unit 220. However, the B1 information acquiring apparatus 200 may include more components or less components than the components shown in FIG. 2. The plurality of RF coil elements 210 may apply RF pulses to a target object that may be generated and applied to the target object based on a user input, RF pulse information stored in a memory (not shown), or a command of the control unit 220. Furthermore, the plurality of RF coil elements 210 may receive responses corresponding to the RF pulses from the target object. The plurality of RF coil elements 210 may include a transmission coil element and/or a reception coil element and/or a transmission/reception coil element.

The control unit 220 may control the overall operation of the B1 information acquiring apparatus 200. For example, the control unit 220 may independently control the respective RF coil elements 210 by executing programs stored in a memory (not shown). Furthermore, the control unit 220 may control the overall operation of the MRI system 100. Control unit 220 may include a first information acquiring unit 222, a second information acquiring unit 224, and a third information acquiring unit 226. The first information acquiring unit 222 may acquire first information regarding B1 magnetic fields formed by driving the respective RF coil elements 210. The second information acquiring unit 224 may acquire second information regarding a B1 magnetic field formed by combinations of two or more of the plurality of RF coil elements 210. The third information acquiring unit 226 may acquire third information regarding a B1 magnetic field formed by at least of the plurality of RF coil elements 210 by combining the first information acquired by the first information acquiring unit 222 with the second information acquired by the second information acquiring unit 224. The third information acquiring unit 226 may acquire phase information regarding a transmission RF magnetic field formed by at least of the RF coil elements 210 as the third information. For example, the third information acquiring unit 226 may use the second information to acquire phase information regarding transmission RF magnetic fields (B1+ magnetic fields) by eliminating phase information regarding a reception RF magnetic field (B1− magnetic field) from the first information. The control unit 220 may provide a B1 map indicating spatial distribution of a B1 magnetic field regarding a target object based on acquired B1 information. The B1 map may include an image indicating distributions of magnitudes and/or phases of magnetic fields regarding a target object using colors, highlighting, shading or another visual attribute.

Figure 3:
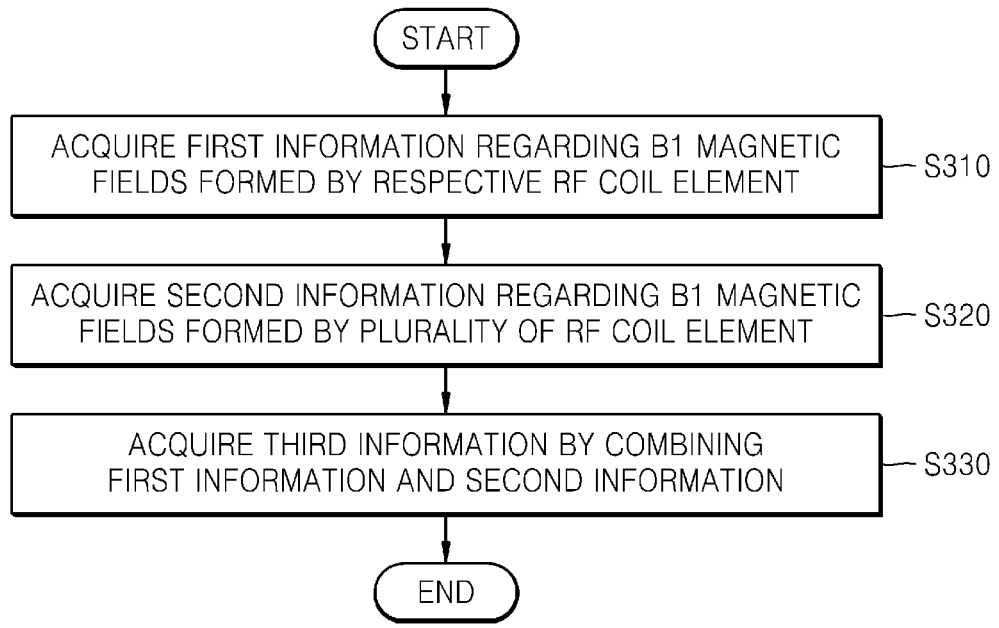
FIG. 3 shows a flowchart of a method of acquiring B1 information according to invention principles.

A method by which the B1 information acquiring apparatus 200 having the above-stated configuration of FIG. 2 acquires B1 information is described in connection with FIG. 3 showing a flowchart of a method of acquiring B1 information. The MRI system 100 may be an MRI system using a high magnetic field of 3 T or higher and individual coils of the plurality of RF coil elements 210 may be independently driven. For example, a magnitude and phase of a current driving an $i^{th}$ RF coil element of the plurality of RF coil elements 210 may be denoted as $(a_i, (\phi_i)$. If a current of cos $\omega_o$ t is generated by a current source oscillating at the Larmor frequency $\omega_o$, the $i^{th}$ coil element 210 may be driven by a current $a_i \cos(\omega_o t+\phi_i)$ having magnitude and phase determined by the control unit 220. In an operation S310, the B1 information acquiring apparatus 200 may acquire first information regarding B1 magnetic fields formed by the respective RF coil elements 210. The first information may be information regarding a magnetic field formed by driving one of the plurality of RF coil elements 210 by transmitting a predetermined RF pulse to a target object via one of the plurality of RF coil elements 210 and receiving an echo signal in response to the applied RF pulse. A detailed description of a method of driving a coil of the plurality of RF coil elements 210 is described in connection with FIG. 4.

Figure 4:
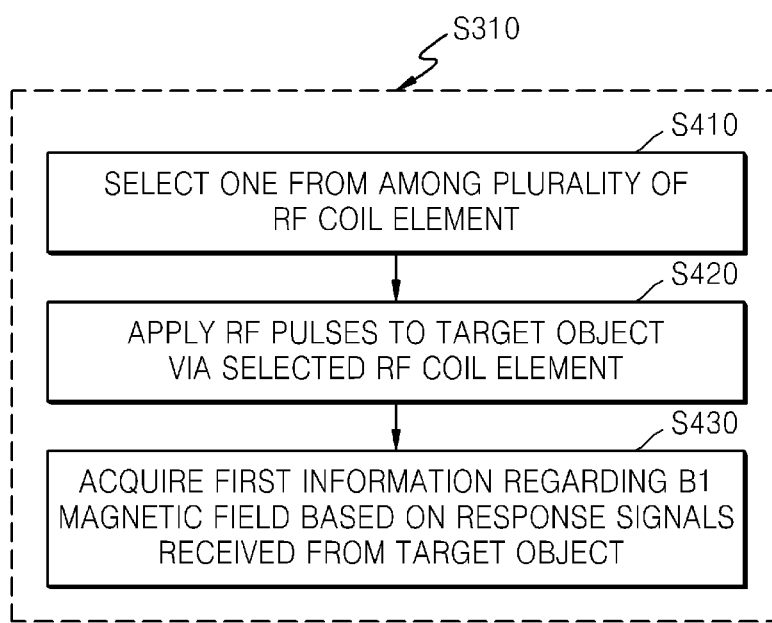
FIG. 4 is a flowchart of a method of acquisition of information associated with a B1 magnetic field according to invention principles.

FIG. 4 is a flowchart of a method of acquisition of first information concerning a B1 magnetic field. In operation S410, the B1 information acquiring apparatus 200 may select one from the plurality of RF coil elements 210. In operation S420, the B1 information acquiring apparatus 200 may apply a predetermined RF pulse to a target object via the RF coil element selected in operation S410. In operation S430, the B1 information acquiring apparatus 200 may acquire first information regarding a B1 magnetic field based on a response signal received from the target object. Operations S410 through S430 are repeated with respect to each of RF coils included in the plurality of RF coil elements 210. For example, for N coil elements, operations S410 through S430 are performed with respect to a first RF coil element, and operations S410 through S430 may be performed with respect to a second RF coil element, and so on. So, operations S410 through S430 may be performed with respect to each of the N RF coil elements. As a result, the B1 information acquiring apparatus 200 may acquire information regarding a plurality of magnetic fields formed by driving the respective RF coil elements 210 as the first information.

A response signal received in response to RF pulses applied in operation S310 may be received by at least one of the RF coil elements 210. Furthermore, the first information may include phase information regarding transmission RF magnetic fields (B1+ magnetic fields) and a reception RF magnetic field (B1− magnetic field) that are formed by the respective RF coil elements 210. For example, the B1 information acquiring apparatus 200 may include N RF coil elements. The B1 information acquiring apparatus 200 may receive an echo response signal generated by a target object using an $i^{th}$ RF coil element from among the N RF coil elements, which is driven by using a current cos $\omega_o$ t, and inputs having zero magnitude are applied to the remaining RF coil elements.

The B1 information acquiring apparatus 200 may amplify the received response signal by using a low noise amplifier (LNA) and generate an MR signal Si. The B1 information acquiring apparatus 200 may acquire MR image data Ii (x, y) from the generated Si via a phase preserving image reconstruction. Here, phase ($\phi_i$ (x, y) of the MR image data Ii (x, y) may be indicated as shown below in Equation 3.

$$\phi_i(x,y)=\phi_{TX,i}(x,y)+\phi_{RX}(x,y), i=1,2, \text{ or } N \quad \text{[Equation 3]}$$

In Equation 3 above, $\phi_{TX,i}$ (x,y) may denote phase distribution of a B1+ magnetic field formed by an $i^{th}$ RF coil element, and $\phi_{RX}$ (x,y) may denote phase distribution of a B1− magnetic field formed by a reception coil. Here, $\phi_{RX}$ (x,y) is a phase value commonly included in an MR image signal received by the reception coil, regardless of which of the plurality of RF coil elements 210 is driven.

N phase distributions determined with respect to the respective N RF coil elements may be expressed as N equations referring to the Equation 3. For example, $\phi_1$ (x,y) may be expressed as $\phi_{TX,1}$ (x,y)+$\phi_{RX}$ (x,y), $\phi_2$ (x,y) may be expressed as $\phi_{TX,2}$ (x,y)+$\phi_{RX}$(x,y), and so on. In this regard, total N phase distributions $\phi_1$(x,y) through $\phi_N$(x,y) may be expressed each in the form of Equation 3.

One more equation is used for acquiring a phase element with respect to the respective RF coil elements (e.g., N $\phi_{TX,i}$ (x,y) elements and one $\phi_{RX}$ (x,y) element), because the number of variables included in the total N equations is N+1.

In order to acquire the respective phase element (e.g., N $\phi_{TX,i}$ (x,y) elements and one $\phi_{RX}$ (x,y) element), additional information is acquired in an operation S320.

In operation S320, the B1 information acquiring apparatus 200 may acquire second information regarding a B1 magnetic field formed by a combination of two or more of the plurality of RF coil elements 210.

For example, the second information may be information acquired based on MR signals received in response to predetermined pulses applied to a target object via two or more coil elements selected from among the plurality of RF coil elements 210. For example, the second information may be information regarding a magnetic field formed using the plurality of RF coil elements 210. Furthermore, the second information may include phase information regarding a transmission RF magnetic field (B1+ magnetic field) and a reception RF magnetic field (B1− magnetic field) formed by a combination of two or more of the plurality of respective RF coil elements 210.

For example, in response to driving the $i^{th}$ RF coil element by using a current cos $\Omega_o$t in operation S310, a current $$\frac{1}{N}(\cos\omega_o t)$$

may be concurrently applied to the N RF coil elements. The B1 information acquiring apparatus 200 may generate an MR signal $S_{total}$ by amplifying a received response signal using a LNA and acquire MR image data Ii (x, y) from the MR signal $S_{total}$ via a phase preserving image reconstruction. Here, phase $\phi_{total}$ (x, y) of MR image data $I_{total}$ (x, y) may be expressed as Equation 4 below.

$$\phi_{total}(x,y)=\phi_{TX,total}(x,y)+\phi_{RX}(x,y) \quad \text{[Equation 4]}$$

In Equation 4 above, $\phi_{TX,total}$ (x, y) may denote phase distribution of a B1+ magnetic field formed as all of N RF coil elements are simultaneously driven, and $\phi_{RX}$ (x, y) may denote phase distribution of a B1− magnetic field formed by a reception coil.

In an operation S330, the B1 information acquiring apparatus 200 may acquire third information regarding a B1 magnetic field by using the first information and the second information respectively acquired in operations S310 and S320. For example, the third information may include phase information regarding a transmission RF magnetic field (B1+ magnetic field) formed by at least one of the plurality of RF coil elements 210. Operation S330 may include a sub-operation for combining the first information and the second information respectively acquired in operations S310 and S320 and a sub-operation for acquiring phase information regarding a B1+ magnetic field and phase information regarding a B1− magnetic field based on a result of the combination. Here, the term "combination of information" may include mathematical calculation.

The information acquired in operation S330 may include phase information regarding B1+ magnetic fields formed by the respective RF coil elements 210. Furthermore, the B1 information acquiring apparatus 200 may further acquire phase information regarding B1− magnetic fields formed by the respective RF coil elements by combining the first information and the second information respectively acquired in operations S310 and S320. For example, the B1 information acquiring apparatus 200 may acquire phase information regarding transmission RF magnetic fields (B1+ magnetic fields) by eliminating phase information regarding a reception RF magnetic field (B1− magnetic field) from the first information, by using the second information.

For example, Equation 5 below may be established based on a magnitude-phase relation between measured B1 maps.

$$|B^+_{1,total}(x,y)|\cos(\phi_{total}(x,y)) = \frac{1}{N}\sum_{i=1}^{N}|B^+_{1,i}(x,y)|(\cos\phi_i(x,y))$$ [Equation 5]

In Equation 5 above, $|R_{1,j}^+(x,y)|$ denotes a magnitude distribution of a B1+ magnetic field formed when only an $i^{th}$ RF coil element is driven by using a current $\cos\omega_o t$. $|B^+_{1,total}(x,y)|$ denotes a magnitude distribution of a B1+ magnetic field formed when N RF coil elements are driven by using a current $$\frac{1}{N}(\cos\omega_o t).$$

N+1 phase distributions $\phi_{TX,1}(x, y)$ through $\phi_{TX,N}(x, y)$ and $\phi_{RX}(x, y)$ may be acquired by calculating Equations 3 through 5.

Phase distribution of B1+ magnetic fields formed by N transmission coil elements and phase distribution of a B1− magnetic field formed by a reception coil may be acquired. The B1 information acquiring apparatus 200 may acquire the phase distribution of the B1+ magnetic field formed by the N transmission coil elements as the third information. Phase information regarding a B1+ magnetic field may be acquired using a method of acquiring B1 information. The acquired phase information regarding the B1+ magnetic field may be used for B1 shimming for improving spatial uniformity of the B1+ magnetic field and electrical property tomography (EPT) for imaging electrical conductivity distribution in a human body.

Furthermore, an MRI system may acquire a B1+ map and perform B1 shimming based on the acquired B1+ map. Amplitude or phase of a high-frequency current for driving a RF coil element may be controlled based on an acquired B1+ map until a desired B1+ map is acquired. For example, the MRI system may perform B1 shimming, such that B1+ magnetic fields are uniformly distributed on a target object. The system may be implemented using computer instructions which can be executed by various computer means, and recorded on a computer-readable medium. The computer-readable medium may include program commands, data files, data structures or a combination thereof. Program instructions recorded on the medium may be particularly designed and structured for the present invention or available to those skilled in computer software. Examples of the computer-readable recording medium include magnetic media, such as a hard disk, a floppy disk, and a magnetic tape; optical media, such as a compact disk-read only memory (CD-ROM) and a digital versatile disc (DVD); magneto-optical media, such as optical disks; a read-only memory (ROM); a random access memory (RAM); and a flash memory. The medium may be a transmission medium, such as an optical or metal line and a waveguide transferring program commands, data structures, and the like. Program commands may include, for example, a high-level language code that can be executed by a computer using an interpreter, as well as a machine language code made by a compiler. While the system has been particularly shown and described with reference to exemplary embodiments thereof, it will be understood by those of ordinary skill in the art that various changes in form and details may be made therein.

The above-described embodiments can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. The functions and process steps herein may be performed automatically or wholly or partially in response to user command. An activity (including a step) performed automatically is performed in response to executable instruction or device operation without user direct initiation of the activity. No claim element herein is to be construed under the provisions of 35 U.S.C. 112, sixth paragraph, unless the element is expressly recited using the phrase "means for."

DEFINITIONS

TI comprises inversion time, the time between an inversion recovery pulse and the next RF excitation pulse. TI determines the image contrast.

T1 comprises the longitudinal (or spin-lattice) relaxation time T1 decay constant.

T2 comprises the transverse (or spin-spin) relaxation time T2 is the decay constant for a proton spin component.

TR comprises repetition time, the time between successive RF excitation pulses.

Flip angle is an angle to which the net magnetization of a proton is rotated or tipped relative to the main magnetic field direction via the application of an RF excitation pulse at the Larmor frequency, i.e., an RF flip angle. For an inversion pulse, FA=180 degrees.

B0 is the main static base MRI magnetic field.
B1 is the RF transmit coil field.

What is claimed is:

1. A method of acquiring B1 magnetic field information from RF magnetic field information in response to generated radio frequency (RF) pulses applied to a target object via at least one of a plurality of RF coil elements in a magnetic resonance imaging (MRI) system, the method comprising:
   acquiring first information comprising B1 magnetic field phase information of a B1 magnetic field formed by the respective RF coil elements;
   acquiring second information comprising B1 magnetic field phase information of a B1 magnetic field formed by a combination of two or more of the plurality of RF coil elements;
   acquiring phase information of transmission RF magnetic fields (B1+ magnetic fields) as third information comprising B1 magnetic field phase information by eliminating phase information of a reception RF magnetic field (B1− magnetic field) from the first information by using the second information;
   applying RF pulses to the target object by activating the plurality of RF coil elements using signals having individual magnitudes and phases, respectively, based on the third information,
   receiving responses corresponding to the RF pulses from the target object; and
   generating an MR image regarding to the target object based on the response.

2. The method of claim 1, wherein the B1+ magnetic fields comprise magnetic field elements which rotate in a same direction as a direction in which a magnetization vector of at least one atomic nucleus, which is magnetized by a main magnetic field of the MRI system and is included in a target object, rotates.

3. The method of claim 2, further comprising acquiring the phase information of the B1− magnetic field by combining the first information and the second information, wherein the B1− magnetic field comprises a magnetic field element which rotates in a direction opposite to the direction in which the B1+ magnetic field rotates.

4. The method of claim 1, wherein the acquiring of the first information formed by the respective RF coil elements comprises:
   for individual coils of the plurality of RF coil elements, selecting one of the plurality of RF coil elements;
   applying the RF pulses to the target object via the selected RF coil element; and
   acquiring the first information using echo response signals received from the target object.

5. The method of claim 1, wherein the first information comprises phase information of a B1+ magnetic field formed by the respective RF coil elements and phase information of a B1− magnetic field.

6. The method of claim 1, wherein the acquiring of the second information comprises:
   applying the RF pulses to the target object concurrently via the combination of two or more of the plurality of RF coil elements; and
   acquiring the second information based on echo response signals received from the target object.

7. The method of claim 1, wherein the acquiring of the second information comprises acquiring the second information by concurrently driving the plurality of RF coil elements.

8. The method of claim 1, wherein the second information comprises phase information of a B1+ magnetic field formed by the combination of two or more of the plurality of RF coil elements and phase information of a B1− magnetic field.

9. The method of claim 1, wherein the MRI system is an MRI system using a high magnetic field equal to 3 Tesla (T) or higher.

10. A computer readable recording medium having recorded thereon a computer program for implementing the method of claim 1.

11. An MRI system comprising at least one of a plurality of radio frequency (RF) coil elements for acquiring B1 magnetic field information in response to RF pulses applied to a target object and a control unit which controls the plurality of RF coil elements,
   the control unit configured to:
      acquire first information comprising B1 magnetic field phase information of a B1 magnetic field formed by the respective RF coil elements;
      acquire second information comprising B1 magnetic field phase information of a B1 magnetic field formed by a combination of two or more of a plurality of RF coil elements; and
      acquire phase information of transmission RF magnetic fields (B1+ magnetic fields) as third information by eliminating phase information of a reception RF magnetic field (B1− magnetic field) from the first information by using the second information,
   the plurality of RF coil elements configured to:
      apply RF pulses to the target object by activating the plurality of RF coil elements using signals having individual magnitudes and phases, respectively, based on the third information, and
      receive responses corresponding to the RF pulses from the target object,
   wherein the control unit generate an MR image regarding to the target object based on the responses.

12. The MRI system of claim 11, wherein the B1+ magnetic fields comprise magnetic field elements which rotate in a same direction as a direction in which a magnetization vector of at least one atomic nucleus, which is magnetized by a main magnetic field of the MRI system and is included in a target object, rotates.

13. The MRI system of claim 12, wherein the control unit is further configured to acquire the phase information of the B1− magnetic field by combining the first information and the second information, and
   the B1− magnetic field comprises a magnetic field element rotating in a direction opposite to the direction in which the B1+ magnetic fields rotate.

14. The MRI system of claim 11, wherein the control unit is configured to:
   for individual coils of the plurality of RF coil elements,
   select one of the plurality of RF coil elements;
   apply the RF pulses to the target object via the selected RF coil element;
   receive echo response signals from the target object; and
   acquire the first information based on the echo response signals received from the target object.

15. The MRI system of claim 11, wherein the first information comprises phase information of a B1+ magnetic field formed by the respective RF coil elements and phase information of a B1− magnetic field.

16. The MRI system of claim 11, wherein the control unit is configured to:
- apply the RF pulses to the target object concurrently using the combination of two or more of the plurality of RF coil elements and
- receive echo response signals from the target object, and acquire the second information using the echo response signals.

17. The MRI system of claim 11, wherein the control unit acquires the second information by concurrently driving the plurality of RF coil elements.

18. The MRI system of claim 11, wherein the second information comprises phase information of a B1+ magnetic field formed by the combination of two or more of the plurality of RF coil elements and phase information of a B1− magnetic field.

19. The MRI system of claim 11, wherein the MRI system uses a high magnetic field equal to 3 Tesla (T) or higher.

* * * * *